(12) United States Patent
Baorda et al.

(10) Patent No.: US 10,928,464 B2
(45) Date of Patent: Feb. 23, 2021

(54) TEMPERATURE COMPENSATION CIRCUIT, CORRESPONDING DEVICE AND METHOD

(71) Applicant: STMicroelectronics S.r.l., Agrate Brianza (IT)

(72) Inventors: Roberto Pio Baorda, Binasco (FR); Paolo Angelini, Bologna (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 193 days.

(21) Appl. No.: 16/149,937

(22) Filed: Oct. 2, 2018

(65) Prior Publication Data
US 2019/0107584 A1    Apr. 11, 2019

(30) Foreign Application Priority Data

Oct. 6, 2017   (IT) .................. 102017000112416

(51) Int. Cl.
  *G01R 33/00*    (2006.01)
  *G01R 19/32*    (2006.01)
  *G01R 33/07*    (2006.01)
  *G01R 15/20*    (2006.01)

(52) U.S. Cl.
  CPC ......... *G01R 33/0082* (2013.01); *G01R 19/32* (2013.01); *G01R 33/0041* (2013.01); *G01R 33/0052* (2013.01); *G01R 33/07* (2013.01); *G01R 33/072* (2013.01); *G01R 15/202* (2013.01)

(58) Field of Classification Search
  CPC ... G01R 33/0041; G01R 19/32; G01R 33/072
  See application file for complete search history.

(56) References Cited

U.S. PATENT DOCUMENTS

| | | | |
|---|---|---|---|
| 4,634,961 A | 1/1987 | Popovic et al. | |
| 4,833,406 A * | 5/1989 | Foster | G01D 3/032 324/225 |
| 6,104,231 A | 8/2000 | Kirkpatrick, II | |
| 6,630,882 B1 | 10/2003 | Heremans et al. | |
| 8,604,777 B2 | 12/2013 | Doogue et al. | |
| 9,864,038 B2 | 1/2018 | Fujita et al. | |

(Continued)

FOREIGN PATENT DOCUMENTS

| | | | |
|---|---|---|---|
| EP | 0357013 A2 | 3/1990 | |
| JP | 2015018313 * | 1/2015 | ............. G01R 33/07 |
| JP | 2015018313 A | 1/2015 | |

OTHER PUBLICATIONS

Blagojevic M et al: "FD SOI Hall sensor electronics interfaces for energy measurement", Microelectronics Journal, Mackintosh Publications Ltd. Luton, GB, vol. 37, No. 12, Dec. 1, 2006, pp. 1576-1583.

(Continued)

*Primary Examiner* — Alvaro E Fortich
(74) *Attorney, Agent, or Firm* — Crowe & Dunlevy

(57) ABSTRACT

A Hall sensor compensation circuit includes an input node configured for receiving a bias signal for a Hall sensor. A bias node provides to the Hall sensor a compensated bias signal. A compensation network coupled between the input node and the bias node has a gain inversely proportional to Hall mobility, $\mu_n'$, wherein the Hall sensing signal is temperature-compensated.

21 Claims, 2 Drawing Sheets

(56) References Cited

U.S. PATENT DOCUMENTS

| | | |
|---|---|---|
| 10,345,394 B2 | 7/2019 | Raman et al. |
| 2011/0074405 A1 | 3/2011 | Doogue et al. |
| 2012/0112733 A1* | 5/2012 | Antonacci ............ G01R 33/072 323/368 |
| 2014/0103921 A1* | 4/2014 | Raman ............... G01R 33/0041 324/251 |
| 2016/0356862 A1* | 12/2016 | Ariyama ................ G01R 33/07 |
| 2018/0017637 A1* | 1/2018 | Cesaretti ................ G01R 33/07 |
| 2019/0107584 A1 | 4/2019 | Baorda et al. |
| 2019/0113550 A1 | 4/2019 | Hong |

OTHER PUBLICATIONS

Popovic, R.S.: "Hall magnetic sensors" In : "Hall effect devices", Dec. 1, 2003 (Dec. 1, 2003), Chapman and Hall (88 pages).

Italian Search Report and Written Opinion for IT Appl. No. 102017000112416 dated Jun. 6, 2018 (9 pages.).

* cited by examiner

TEMPERATURE COMPENSATION CIRCUIT, CORRESPONDING DEVICE AND METHOD

PRIORITY CLAIM

This application claims the priority benefit of Italian Application for Patent No. 102017000112416, filed on Oct. 6, 2017, the content of which is hereby incorporated by reference in its entirety to the maximum extent allowable by law.

TECHNICAL FIELD

The description relates to temperature compensation in electronic circuits.

One or more embodiments may be applied to temperature compensation in Hall sensors.

BACKGROUND

The sensitivity of Hall sensors may be strongly dependent on temperature.

An approach to deal with such a temperature drift may involve biasing the sensor with a constant current in the place of a constant voltage.

A sensor biased with a constant current can be stable versus temperature in the presence of a small current. Unfortunately, a small bias current generates a small output signal, and such an approach may not be satisfactory for low-noise applications.

Another approach for dealing with temperature dependency may involve a re-distribution of a supply current between the Hall sensor and a shunt resistor. This makes it possible to vary the input current $I_{in}$ to the sensor thereby compensating a change in Hall sensitivity.

Such an approach has a drawback in that it relies on an expectedly linear temperature behavior of the sensitivity of the Hall element, which represents only an approximate model of the real behavior. In the presence of a large bias current to the sensor, the temperature dependency may become non-linear. Consequently, the approach discussed in the foregoing lends itself to be applied only for relatively small bias currents, which is hardly compatible with low-noise applications.

Also, this latter approach assumes a linear temperature behavior of the shunt resistor which, again, only represents an approximate model of the real behavior. Furthermore, the shunt resistor leads to extra current consumption in addition to the consumption of the Hall sensor and may be sensitive to process variations with a compensation resistor unable to properly track the Hall sensor parameters.

Still another approach for compensating temperature drift in Hall sensors is disclosed in Italian Patent Application No. 102017000071189 filed Jun. 26, 2017 (incorporated by reference).

SUMMARY

One or more embodiments may relate to a corresponding device and to a corresponding method.

The claims are an integral part of the disclosure of embodiments as provided herein.

One or more embodiments may facilitate the provision of circuits to bias Hall sensor elements and compensate their sensitivity temperature drift.

One or more embodiments may involve compensating the sensitive temperature drift in a Hall sensor by sensing temperature and varying correspondingly the biasing conditions of the sensor.

One or more embodiments may facilitate achieving high temperature stability and high accuracy of a Hall sensor element.

One or more embodiments may provide biasing for a Hall element while at the same time performing sensitivity vs. temperature compensation.

One or more embodiments may provide a compensation capable of tracking Hall sensor corner variations by possibly avoiding process corner calibration.

One or more embodiments may compensate Hall sensitivity temperature drift by using a bias circuit which tracks also the Hall sensitivity drift variations due to corner.

One or more embodiments may include two or more Hall elements in a single device.

In an embodiment, a circuit comprises: an input node configured for receiving a bias signal for a Hall sensor, the Hall sensor providing a Hall sensing signal; a bias node configured for providing a compensated bias signal for the Hall sensor; a compensation network between the input node and the bias node, wherein the compensation network has a gain inversely proportional to Hall sensor mobility, $\mu_n'$, wherein the Hall output voltage $V_H$ sensing signal is temperature-compensated.

In one or more embodiments, the compensation network may include a gain control input configured for receiving a temperature-dependent control signal, the gain of the compensation network controllable as a function of the control signal with said gain inversely proportional to the ratio, $r_n$, of the Hall mobility, $\mu'_n$, to the drift mobility $\mu_n$.

In one or more embodiments, the compensation network may include a gain-setting component having a resistance value inversely proportional to Hall mobility, $\mu_n'$, where $r_n$=Hall mobility/Drift mobility=$\mu_n'/\mu_n$, that is $\mu_n=\mu_n'/r_n$, so that $\mu_n$ is a function of via $r_n$.

In one or more embodiments, the gain-setting component may include a series arrangement of gain-setting elements having a resistance value inversely proportional to Hall mobility, $\mu_n'$, where $r_n$=Hall mobility/Drift mobility=$\mu_n'/\mu_n$, that is $\mu_n=\mu_n'/r_n$ so that $\mu_n$ is a function of $\mu_n'$, via $r_n$.

In one or more embodiments, the gain-setting component may include at least one resistance control input configured for receiving said temperature-dependent control signal, the resistance value of the gain-setting component controllable as a function of the control signal at the at least one resistance control input.

In one or more embodiments, the gain-setting component may include at least one depletion region in a first semiconductor well formed in a semiconductor well of opposed polarity.

In one or more embodiments, the control signal at the at least one resistance control input may be active on the thickness of said depletion region in said first well.

In one or more embodiments, the gain-setting component may include at least one Hall element, preferably a series arrangement of Hall elements.

In one or more embodiments, the compensation network may include a differential stage having a first input and a second input as well as an output, wherein the differential stage is arranged with: the first input coupled to the input node, the output driving the bias node, a feedback line from the bias node to the second input, the feedback line including the gain-setting component.

One or more embodiments may include a voltage divider network active between the bias node and the second input of the differential stage wherein the divider network includes the gain-setting component.

In one or more embodiments, the divider network may include: the gain-setting component set between the bias node and a tap point of the divider network, a resistive component set between the tap point and ground, wherein the tap point of the divider network may be coupled to the second input of the differential stage.

One or more embodiments may include a transistor having a control terminal driven by the output of the differential stage and a current path therethrough coupled to the bias node.

In an embodiment, a device comprises: a Hall sensor to provide a Hall sensing signal, and a circuit according to one or more of the foregoing embodiments, the circuit having the bias node coupled to the Hall sensor to provide said compensated bias signal to the Hall sensor.

In one or more embodiments, the Hall sensor may be formed in an epitaxial layer of semiconductor material, and the compensation network may include at least one gain-setting component formed in the same epitaxial layer of the Hall element.

In an embodiment, a method comprises: receiving a bias signal for a Hall sensor providing a Hall sensing signal, applying to the bias signal received a compensation gain inversely proportional to Hall mobility, $\mu_n'$, to provide a compensated bias signal for the Hall sensor, and applying to the Hall sensor the compensated bias signal wherein the Hall sensing signal is temperature-compensated.

One or more embodiments may include applying to the bias signal received a compensation gain inversely proportional to the ratio, $r_n$, of the Hall mobility, $\mu'_n$, to the drift mobility $\mu_n$.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured. Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

One or more embodiments may apply to the readout of a Hall (effect) magnetic sensor as used to measure the magnetic field generated by an electrical current flowing near the Hall sensor element. Using a magnetic sensor to measure an electrical current may provide various advantages over other techniques, such as zero insertion loss and galvanic isolation from the primary circuit where the current flows.

As noted, Hall sensors used as current sensors may also have certain drawbacks, which can be addressed in the readout circuits.

Figure 1:
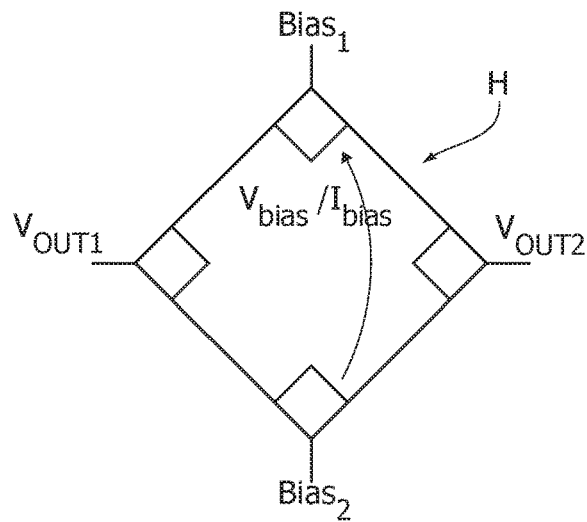
FIG. 1 is exemplary of the structure of a Hall sensor.

As exemplified in FIG. 1, a Hall sensor H can comprise silicon integrated circuits as an N doped well with four contacts. Two contacts Bias 1, Bias 2 can be used to provide a bias current or voltage to the sensor H, while the other two contacts $V_{OUT1}$, $V_{OUT2}$ can be used to read the output voltage of the sensor H, as a differential voltage sensed between $V_{OUT1}$ and $V_{OUT2}$.

A limitation of Hall sensors can be related to the (strong) temperature dependence of the output voltage.

For instance, in a sensor biased with a constant voltage, the output voltage can drop by about 2.5 times with a temperature change from −40° C. to 150° C.

Furthermore, this temperature dependence may be non-linear and process-dependent.

These factors may militate against making use of Hall sensors acceptable as current sensors for certain applications. Compensation of temperature dependence may thus play a role in making Hall sensors good candidates (also) for these applications.

Sensitivity of Hall sensors has been known to be dependent on various physical and electrical parameters.

For instance, known expressions of the sensitivity of a Hall sensor are:

$$S_I = V_h/B_z = (r_n/qtN_D)G_T I \quad (1)$$

$$S_V = V_h/B_z = \mu_n'G_T V_{bias}(W/L) \quad (2)$$

where:
$S_I$ is the sensitivity when the sensor is biased with a current I
$S_V$ is the sensitivity when the sensor is biased with a voltage $V_{bias}$
$B_z$=Magnetic field perpendicular to plane of the sensor
q=Electron charge
$N_D$=N-type carrier density in the Hall element
t=Thickness of the Hall element
W and L are the width and the length of the Hall element
$V_h$=Hall output voltage
$G_T$=Hall element geometry factor
$r_n$=Hall mobility/Drift mobility=$\mu_n'/\mu_n$
I=bias current of the Hall element
$V_{bias}$ bias voltage of the Hall element By looking at $S_V$, one may note that $G_T$, W and L are not temperature-dependent, $V_{bias}$ is a project parameter, while $\mu_n'$, which is proportional to the drift mobility $\mu_n$ is (strongly) temperature dependent. So, if the sensor is biased with a fixed voltage, its temperature drift is due to the temperature drift of the mobility $\mu_n'$.

As noted, an approach for addressing the issue of temperature drift of the output voltage in a Hall sensor is to bias the sensor with a constant current, instead of a constant voltage: by looking at the formula for $S_I$ one notes that in this case the temperature dependence is due to parameters $r_n$ and t; $r_n$ has just a slight temperature dependence (~3% on the full temperature range) and t is at least approximately constant.

It is noted that the sensor thickness t can be considered constant only if the bias current is small; otherwise, if the bias current is high, the voltage drop on the sensor element is correspondingly larger, and this will cause an increase of the depleted region at the interface between the sensor n-well and the p-well which surrounds the sensor. The increase of the depleted region translates into a reduction of the effective thickness of the sensor n-well. Thus, with a larger depleted region, the thickness of the Hall element t became strongly temperature dependent due to the fact that the depleted region itself is temperature dependent.

A sensor biased with a constant current is thus stable versus temperature insofar as the bias current is small enough; a small bias current generates a small output signal, so that this solution does qualify as a good candidate for low-noise applications.

Another approach may involve biasing a Hall sensor with a current which has a temperature dependence that is able to compensate the temperature variation of the $(r_n/qtN_D)$ term in the expression of $S_I$.

This can be done by arranging a resistor in parallel with the Hall sensor and by biasing the circuit with a constant current I. It can be demonstrated that a proper value $R_0$ can be found for the resistor which compensates the temperature dependence of the output voltage of the Hall sensor.

It is noted that this solution is effective only if certain conditions are met:
the parallel resistor has a linear temperature dependence which is known and constant over process spread;
the resistance of the Hall plate has a linear temperature dependence which is known and constant over process spread;
the quantity $(r_n/qtN_D)G_T$, which included in the expression for the Hall sensitivity, has a linear temperature dependence which is known and constant over process spread.

These conditions are difficult to meet in a conventional silicon process, insofar as the temperature dependence of resistors is not linear and is not constant over process spread.

Additionally, such an approach may be sensitive to process variations because the compensation resistor may be unable to track the Hall sensor parameters, thus possibly requiring an additional trimming step.

Moreover, as already explained, the third condition above will not be matched for a high bias current, which is a common condition for low-noise applications.

Further details on such an approach can be found in textbooks such as R. S. Popovich, Hall Effect Devices, Taylor & Francis, 2003, 4.4.2—pp. 187 ff (incorporated by reference).

Figure 2:
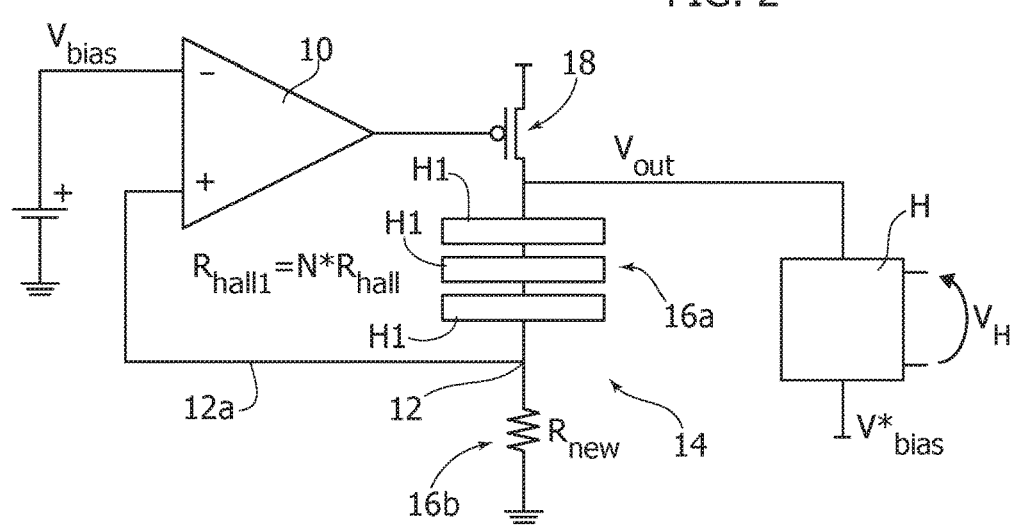
FIG. 2 is a block diagram exemplary of a temperature compensation arrangement for a Hall sensor.
Figure 3:
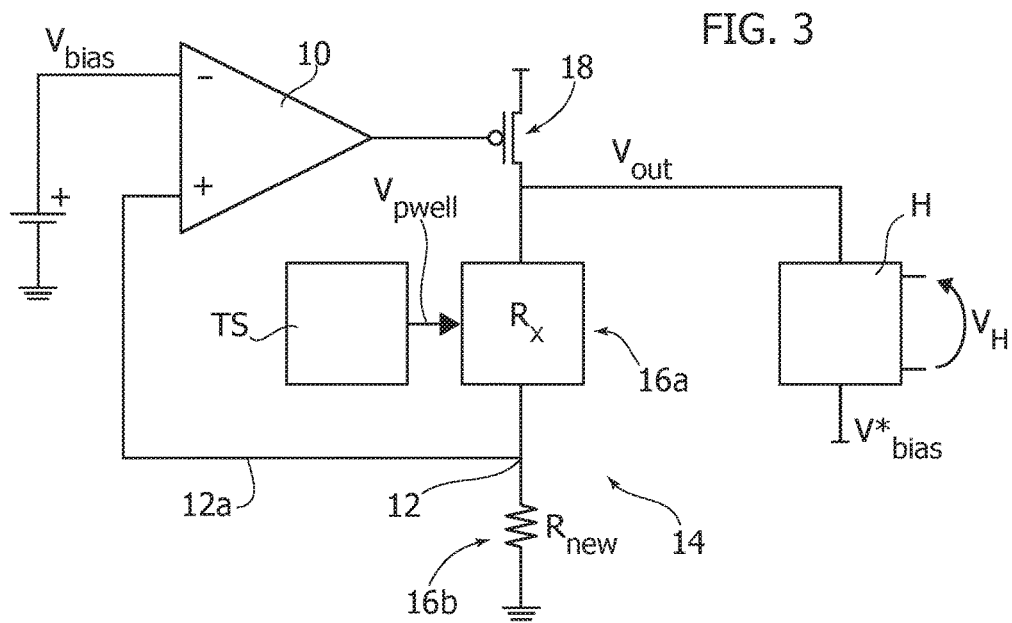
FIG. 3 is a block diagram exemplary of a temperature compensation arrangement for a Hall sensor.

In FIGS. 2 and 3, reference H indicates a Hall sensor (Hall element) to which a bias voltage $V_{bias}$ is applied via a biasing network.

In one or more embodiments as exemplified herein, the Hall element H may be of any known type providing a Hall output voltage $V_H$ by being arranged between two nodes to which voltages $V_{out}$ and $V^*_{bias}$ are applied (see, for example, the general representation provided in FIG. 1).

In one or more embodiments as exemplified herein, the voltage $V_{out}$ may obtained from a bias voltage $V_{bias}$ (derived, like $V^*_{bias}$ from a bias source of a known type—not visible in the figures) via a differential stage 10, an operational amplifier (op-amp).

In one or more embodiments as exemplified herein, the differential stage 10 is arranged with:
a first (inverting) input providing an input node to which the bias voltage $V_{bias}$ is applied, and
a second (non-inverting) input coupled to a tap point 12 of a (voltage) divider network 14 active between the line providing the voltage $V_{out}$ to the Hall sensor H and ground.

In one or more embodiments as exemplified herein, the divider network 14 includes:
a first component 16a (to be discussed in the following) set between the line providing the voltage $V_{out}$ to the Hall sensor H and the tap node 12; and
a second component 16b set between the tap node 12 and ground.

The output from the differential stage 10 drives a transistor (a MOSFET transistor, for instance) 18 via its control terminal (gate, in the case of a field effect transistor such as a MOSFET transistor), with the line providing the voltage $V_{out}$ to the Hall sensor H coupled to the current path (source-gate in the case of a field effect transistor such as a MOSFET transistor) of the transistor 18.

In one or more embodiments as exemplified herein, the divider network 14 and the line 12a, which couple the tap point 12 to the (non-inverting) input of the differential stage 10, provide a feedback path from the output to the input of the differential stage 10.

In one or more embodiments as exemplified in FIG. 1, the (upper) component 16a in the divider network 14 includes one or more Hall elements H1 (N elements in series) each having a resistance value $R_{hall}$, so that the component 16a will exhibit a resistance value $R_{hall}1=N*R_{hall}$, while the (lower) component 16b in the divider network 14 will exhibit a resistance value $R_{new}$.

In one or more embodiments as exemplified herein, the Hall sensing element H will be biased between $V_{out}$ and $V^*_{bias}$, with the voltage $V_{out}$ obtained through a (compensation) regulator network including the divider 14 and the feedback line 12, 12a wherein the following relationships apply:

$$R_{Hall1} = N*R_{hall} = (1/\mu_n)((L*N)/(Wt_1qN_D)) \tag{3}$$

$$V_{out} = V_{bias}(1+(R_{hall1}/R_{new})) \tag{4}$$

By combining the relationships (2), (3) and (4)—while keeping in mind that $r_n$=Hall mobility/Drift mobility=$\mu_n'/\mu_n$, that is $\mu_n=\mu_n'/r_n$ so that $\mu_n$ is a function of $\mu_n'$, via $r_n$ (with $\mu_n'$ proportional to $\mu_n$), the Hall output voltage $V_H$ can be written as follows:

$$\begin{aligned} V_H &= (V_{out} - V^*_{bias})\mu_n'G_T(W/L)B \\ &= (V_{bias}(1+(R_{hall1}/R_{new})) - V^*_{bias})\,\mu_n'G_T(W/L)^*B \\ &= (V_{bias} - V^*_{bias})\mu_n'G_T(W/L)^*B + V_{bias}\,r_n(N/(R_{new}t_1qN_D))\,G_T^*B \end{aligned} \tag{5}$$

which, with $(V_{bias}-V^*_{bias})=0$ (which can be obtained by deriving both voltages from a same source), can be further rewritten as:

$$V_H = V_{bias}r_n(N/(R_{new}t_1qN_D))G_T^*B \tag{6}$$

Equation (6) above shows that the Hall output voltage $V_H$ is no longer dependent on $\mu_n'$ with (in the case component 16a includes N elements H1 in series with resistance $R_{hall}$) $t_1$ the effective thickness of each element H1 in the series arrangement of the component 16a.

With a bias arrangement as exemplified herein, the voltage drop across each element H1 will be about $(V_{out}-V_{bias})/N$, which is N times smaller than the voltage drop across the (single) Hall sensing element H.

With a bias arrangement as exemplified herein, the depleted region in each element H1 (with resistance $R_{hall}$) in the series is (much) smaller, assuming that the voltage $P_{well}$ surrounding each element is biased at the same voltage as the low bias terminal of each Hall element. For this reason, the parameter $t_1$ will be (much) less dependent on temperature than t of a standard solution with current bias as discussed previously, thus facilitating achieving a more constant sensitivity versus temperature behavior.

In one or more embodiments, the component 16a (including N elements H1 in series, each with a resistance $R_{hall}$) may be implemented by using the same physical layout of the Hall sensing device H, with the sensitivity drift due to Hall mobility $\mu_n'$ compensated, i.a. independently of any process corner because $R_{hall}$ will be affected by the same process parameter changes affecting the Hall sensing device H.

It is noted that, in an arrangement as discussed previously, the Hall output voltage $V_H$ may still exhibit a temperature dependence due to $r_n$. By way of (non-limiting) reference, this may be of the order of ±3% considering −40° C. to +150° C. operating temperature range.

Figure 4:
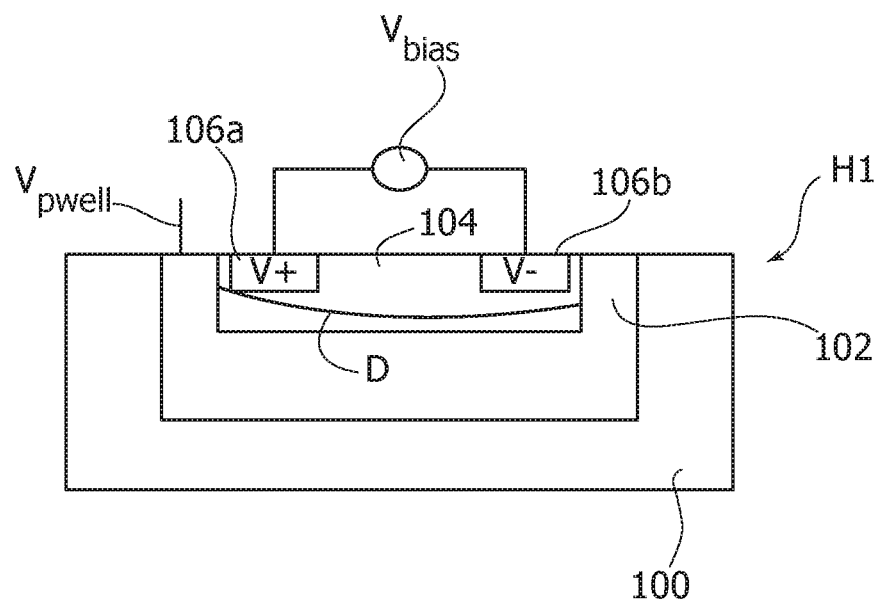
FIGS. 4 and 5 are exemplary of possible details of implementation of embodiments.

FIG. 4 is exemplary of an arrangement wherein a Hall element H1 as adapted to be included in the component 16a is shown including an isolating substrate (for instance a N-type isolating substrate, Niso) 100 in which a P-well 102 is provided in turn hosting a N-well 104 wherein V+ and V− nodes 106a, 106b may be formed across which a bias voltage $V_{bias}$ is applied.

The line D in FIG. 4 is schematically exemplary of the thickness of the depletion region which may be varied by acting on a voltage $V_{pwell}$ applied to the P-well 102.

By varying the voltage $V_{pwell}$, a change in the depletion region in the N-well 104 may occur causing a change of the equivalent (or effective) thickness $t_1$ which affects the Hall plate resistance value.

This facilitates achieving improved temperature stability of the output voltage by effecting a thickness modulation in the components 16a (for example, in each of the elements H1 included therein).

FIG. 4 exemplifies a cross-section through a Hall element, with the effective thickness $t_1$ of the Hall element dependent on the voltage difference between the N-well and the surrounding P-well. This voltage difference generates a depletion region D inside the N-well, which cause a change in the effective thickness of the N-well.

As noted, $t_1$ is one of the parameters appearing in equation (6) expressing the Hall output voltage $V_H$ as a function of $V_{bias}$. The possibility thus exists of using this property to compensate also the $r_n$ residual temperature dependence of $r_n$ (that is, $\mu_n'/\mu_n$) by properly controlling the voltage applied to the P-well of the series:

$$V_H=V_{bias}r_n(N/(R_{new}t_1(V_{pwell})qN_D)G_T*B$$

It is observed that temperature dependence on $r_n$ is quite small (for example 3%) and thus substantially linear. Therefore a $V_{pwell}$ voltage with a small and linear temperature dependence facilitates achieving a very good temperature compensation of the overall output voltage.

For instance, the control voltage $V_{pwell}$ can have a positive temperature (linear) coefficient, which can be made programmable in order to match the temperature dependence of the $r_n$ term.

Figure 5:
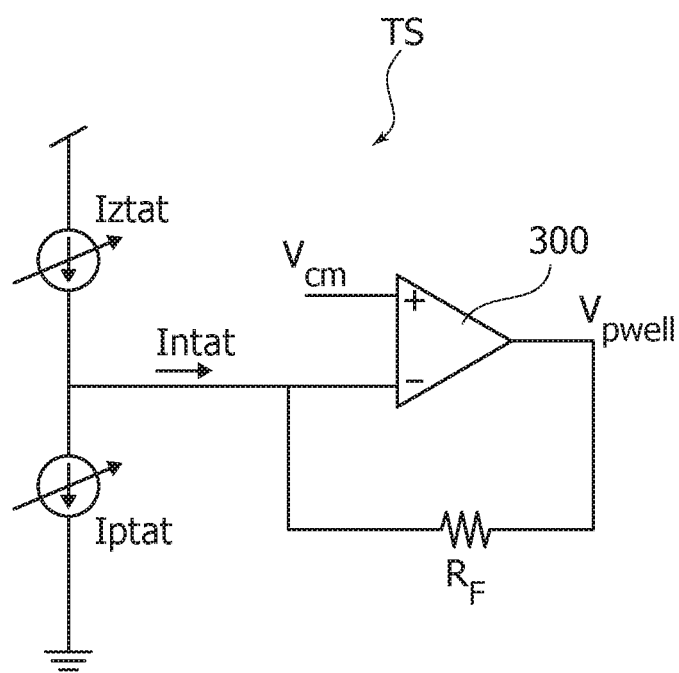

FIG. 5 is exemplary of a possible embodiment of a temperature sensor circuit TS (see also FIG. 3) adapted to provide a control voltage $V_{pwell}$ having a positive temperature (linear) coefficient and which is programmable in order to match the temperature dependence of the term $r_n$ in the relationships above.

In an embodiment as exemplified in FIG. 4, the voltage $V_{pwell}$ can be generated starting from two programmable current generators, one with positive temperature coefficient, namely $I_{ptat}$, and one with zero temperature coefficient, namely $I_{ztat}$, which are circuit blocks commonly available in an application specific integrated circuit (ASIC).

In an embodiment as exemplified in FIG. 5, the $I_{ptat}$ current is subtracted from the $I_{ztat}$ current, in order to generate the current $I_{ntat}$ which has a negative temperature coefficient. This current is injected into the virtual ground of an operational amplifier 300 with a feedback resistance $R_F$. At the output of the operational amplifier 300 voltage will be present equal to $(V_{cm}-I_{ntat}*R)$ which can be used as $V_{pwell}$ voltage. The temperature coefficient of the $V_{pwell}$ voltage can be adjusted programming the $I_{ztat}$ and $I_{ptat}$ current generators.

While Hall elements H1 essentially similar to the Hall element H have been considered in the foregoing for implementing the component 16a, one or mere embodiments as exemplified previously (see FIGS. 2 and 3, this latter with a temperature sensor circuit TS adapted to provide a control voltage $V_{pwell}$) may adopt an arrangement of resistive elements not necessarily in the form of Hall elements for providing the component 16a in the compensation network including the differential stage 10.

Such resistive elements may provide the same type of dependency on mobility of their resistive value (as generally indicated by Rx in FIG. 3) thus making applicable for the resistance of the component 16a the relationship (3) discussed previously, optionally with the possibility of controlling such a resistance value as a function of temperature dependent signal $V_{pwell}$.

Resistive elements formed in the same epitaxial layer of semiconductor material in which the Hall element H is formed (namely corresponding to the layout exemplified in FIG. 4) are exemplary of resistive elements which may provide such dependency on mobility of the value Rx in one or more embodiments.

In one or more embodiments a circuit may include:
- an input node configured for receiving a bias signal ($V_{bias}$) for a Hall sensor (H), the Hall sensor providing a Hall output voltage ($V_H$) sensing signal,
- a bias node configured for providing a compensated bias signal ($V_{out}$) for the Hall sensor,
- a compensation network (10, 12, 14, 16a, 16b, 18) between the input node and the bias node, wherein the compensation network has a gain ($V_{out}/V_{bias}$) inversely proportional to Hall sensor mobility, $\mu_n'$, and wherein the Hall output voltage $V_H$ sensing signal is temperature-compensated (thanks to the variation of $V_{out}$).

In one or more embodiments, the compensation network may include a gain control input (102) configured for receiving a temperature-dependent control signal ($V_{pwell}$), the gain of the compensation network controllable as a function of the control signal with said gain inversely proportional to the ratio, $r_n$, of the Hall mobility, $\mu'_n$, to the drift mobility $\mu_n$ (see for example formulas (5) and (6) above).

It will be otherwise appreciated that the inverse proportionality relationship considered herein is related to thermal dependency: that is, the gain in question has a thermal dependency on temperature which is inversely proportional to that of $r_n$.

In one or more embodiments, the compensation network may include a gain-setting component (16*a*) having a resistance value ($R_{Hall}$1) inversely proportional to Hall mobility, $\mu_n'$: see formula (1) above, by keeping in mind that $r_n$=Hall mobility/Drift mobility=$\mu_n'/\mu_n$, that is $\mu_n=\mu_n'/r_n$ so that $\mu_n$ is a function of $\mu_n'$, via $r_n$.

In one or more embodiments, the gain-setting component (16*a*) may include a series arrangement of (N) gain-setting elements (H1) having a resistance value ($R_{hall}$) inversely proportional to Hall mobility, $\mu_n'$: see for example formula (1) above, always by keeping in mind that $r_n$=Hall mobility/ Drift mobility=$\mu_n'/\mu_n$, that is $\mu_n=\mu_n'/r_n$ so that $\mu_n$ is a function of $\mu_n'$, via $r_n$.

In one or more embodiments, the gain-setting component may include at least one resistance control input (102, possibly one of each of the gain-setting elements H1 in series) configured for receiving said temperature-dependent control signal, the resistance value of the gain-setting component controllable as a function of the control signal at the at least one resistance control input.

In one or more embodiments, the gain-setting component may include at least one depletion region (D in FIG. 3) in a first semiconductor well (104) formed in a semiconductor well (102) of opposed polarity.

In one or more embodiments, the control signal at the at least one resistance control input may be active on the thickness of said depletion region (D) in said first well (104).

In one or more embodiments, the gain-setting component may include at least one Hall element, preferably a series arrangement of (N) Hall elements.

In one or more embodiments, the compensation network may include a differential stage (10) having a first (inverting) input and a second (non-inverting) input as well as an output, wherein the differential stage is arranged with:
the first input coupled to the input node,
the output driving (via a transistor 18) the bias node,
a feedback line (12, 14, 16*a*, 16*b*) from the bias node to the second input, the feedback line including the gain-setting component.

One or more embodiments may include a (resistive) voltage divider network active between the bias node and the second input of the differential stage wherein the divider network includes the gain-setting component.

In one or more embodiments, the divider network may include:
the gain-setting component set between the bias node and a tap point (12) of the divider network,
a resistive component (16*b*) set between the tap point and ground,
wherein the tap point of the divider network may be coupled (via the line 12*a*) to the second input of the differential stage.

One or more embodiments may include a transistor (a mosfet transistor 18) having a control terminal (gate, in the case of a field effect transistor such as a mosfet transistor) driven by the output of the differential stage and a current path (source-drain, in the case of a field effect transistor such as a mosfet transistor) therethrough coupled to the bias node.

A device according to one or more embodiments may include:
a Hall sensor (H) to provide a Hall sensing signal,
a circuit according to one or more embodiments, the circuit having the bias node coupled to the Hall sensor to provide said compensated bias signal to the Hall sensor.

In one or more embodiments, the Hall sensor may be formed in an epitaxial layer of semiconductor material, and the compensation network may include at least one gain-setting component formed in the same epitaxial layer of the Hall element.

In one or more embodiments, a method may include:
receiving a bias signal for a Hall sensor providing a Hall sensing signal,
applying to the bias signal received a compensation gain inversely proportional to Hall mobility, $\mu_n'$, to provide a compensated bias signal for the Hall sensor,
applying to the Hall sensor the compensated bias signal wherein the Hall sensing signal is temperature-compensated.

One or more embodiments may include applying to the bias signal received a compensation gain inversely proportional to the ratio, $r_n$, of the Hall mobility, $\mu_n'$, to the drift mobility $\mu_n$.

It is again noted that the inverse proportionality relationship considered herein is related to thermal dependency: that is, the gain in question has a thermal dependency on temperature which is inversely proportional to that of $r_n$.

Without prejudice to the underlying principles, the details and embodiments may vary, even significantly, with respect to what has been described by way of example only, without departing from the extent of protection.

The extent of protection is defined by the annexed claims.

The invention claimed is:

1. A circuit, comprising:
an input node configured to receive a bias voltage signal equal to a first bias voltage for application to a first bias node of a Hall sensor;
a bias node configured to provide a compensated bias voltage signal for application to a second bias node of the Hall sensor, said Hall sensor configured to provide a Hall sensing signal; and
a compensation network coupled between the input node and the second bias node, wherein the compensation network has a voltage gain inversely proportional to a Hall mobility, $\mu_n'$, of the Hall sensor, and wherein the inversely proportional voltage gain causes the Hall sensing signal to be temperature-compensated.

2. The circuit of claim 1, wherein the compensation network includes a gain control input configured to receive a temperature-dependent control signal, wherein the voltage gain of the compensation network is controllable as a function of the temperature-dependent control signal.

3. The circuit of claim 1, wherein the compensation network includes a gain-setting component having a resistance value inversely proportional to the Hall mobility, $\mu_n'$.

4. The circuit of claim 3, wherein the gain-setting component includes a series arrangement of gain-setting elements having a resistance value inversely proportional to the Hall mobility, $\mu_n'$.

5. The circuit of claim 3, wherein the gain-setting component includes at least one resistance control input configured for receiving a temperature-dependent control signal, the resistance value of the gain-setting component being controllable as a function of the temperature-dependent control signal at the at least one resistance control input.

6. The circuit of claim 5, wherein the gain-setting component includes at least one depletion region in a first semiconductor well formed in a second semiconductor well of opposed polarity.

7. The circuit of claim 6, wherein the temperature-dependent control signal at the at least one resistance control input is active on a thickness of said depletion region in said first semiconductor well.

8. The circuit of claim 3, wherein the gain-setting component includes at least one Hall element.

9. The circuit of claim 3, wherein the compensation network includes a differential stage having a first input and a second input as well as an output, wherein the first input is coupled to the input node, and further comprising a feedback line from the second bias node to the second input, the feedback line including the gain-setting component.

10. The circuit of claim 9, further comprising a divider network coupled between the second bias node and the second input of the differential stage, wherein the divider network includes the gain-setting component.

11. The circuit of claim 10, wherein the divider network includes:
the gain-setting component coupled between the second bias node and a tap point of the divider network, and
a resistive component set between the tap point and ground,
wherein the tap point of the divider network is coupled to the second input of the differential stage.

12. The circuit of claim 11, including a transistor having a control terminal driven by the output of the differential stage and a current path therethrough coupled to the second bias node.

13. A device, comprising:
a Hall sensor including a first bias voltage node, a second bias voltage node and an output configured to provide a Hall sensing signal, and
a circuit coupled to provide a compensated bias signal to the second bias voltage node of the Hall sensor, wherein the circuit comprises:
an input node configured to receive a bias signal equal to a bias voltage at the first bias voltage node of the Hall sensor; and
a compensation network coupled between the input node and the second bias voltage node, wherein the compensation network applies a gain relationship between the bias signal and the compensated bias signal that is inversely proportional to a Hall mobility, $\mu_n'$, of the Hall sensor, and wherein the inversely proportional gain relationship causes the Hall sensing signal to be temperature-compensated.

14. The device of claim 13, wherein the Hall sensor is formed in an epitaxial layer of semiconductor material, wherein the compensation network includes at least one gain-setting component formed in the same epitaxial layer of the Hall sensor.

15. The device of claim 13, wherein the compensation network includes a gain control input configured to receive a temperature-dependent control signal, wherein the gain of the compensation network is controllable as a function of the temperature-dependent control signal.

16. The device of claim 13, wherein the compensation network includes a gain-setting component having a resistance value inversely proportional to the Hall mobility, $\mu_n'$.

17. The device of claim 16, wherein the gain-setting component includes a series arrangement of gain-setting elements having a resistance value inversely proportional to the Hall mobility, $\mu_n'$.

18. The device of claim 16, wherein the gain-setting component includes at least one resistance control input configured for receiving a temperature-dependent control signal, the resistance value of the gain-setting component being controllable as a function of the temperature-dependent control signal.

19. The device of claim 16, wherein the gain-setting component includes at least one depletion region in a first semiconductor well formed in a second semiconductor well of opposed polarity, and wherein the temperature-dependent control signal is active on a thickness of said depletion region.

20. The device of claim 13, wherein the compensation network comprises:
a differential stage having a first input and a second input as well as an output, wherein the first input is coupled to the input node;
a transistor having a control terminal driven by the output of the differential stage and a current path coupled to the second bias voltage node; and
a feedback line from the second bias voltage node to the second input, the feedback line including a gain-setting component.

21. The device of claim 20, wherein the feedback line comprises a divider network coupled between the second bias voltage node and the second input of the differential stage, wherein the gain-setting component is a resistive component of the divider network.

* * * * *